United States Patent
Gamei et al.

(10) Patent No.: US 9,544,599 B2
(45) Date of Patent: Jan. 10, 2017

(54) CONTEXT ADAPTIVE DATA ENCODING

(71) Applicant: Sony Corporation, Minato-ku (JP)

(72) Inventors: James Alexander Gamei, Surrey (GB); Karl James Sharman, Hampshire (GB); Paul James Silcock, Swindon (GB)

(73) Assignee: Sony Corporation, Tokyo (JP)

( * ) Notice: Subject to any disclaimer, the term of this patent is extended or adjusted under 35 U.S.C. 154(b) by 450 days.

(21) Appl. No.: 14/355,143

(22) PCT Filed: Nov. 6, 2012

(86) PCT No.: PCT/GB2012/052762
§ 371 (c)(1),
(2) Date: Apr. 29, 2014

(87) PCT Pub. No.: WO2013/068735
PCT Pub. Date: May 16, 2013

(65) Prior Publication Data
US 2014/0307807 A1 Oct. 16, 2014

(30) Foreign Application Priority Data
Nov. 7, 2011 (GB) .................................. 1119199.6

(51) Int. Cl.
*H04N 19/00* (2014.01)
*H04N 19/98* (2014.01)
(Continued)

(52) U.S. Cl.
CPC ..... *H04N 19/00981* (2013.01); *H03M 7/4018* (2013.01); *H03M 7/42* (2013.01);
(Continued)

(58) Field of Classification Search
CPC .. H04N 19/00981; H04N 19/88; H04N 19/91; H04N 19/98; H04N 7/50; H04N 7/26941; H04N 21/2365; H04N 21/4347; H04N 7/2624; H04N 19/61; H03M 7/42; H03M 7/4018
See application file for complete search history.

(56) References Cited

U.S. PATENT DOCUMENTS

2004/0056787 A1 3/2004 Bossen
2009/0044072 A1* 2/2009 Oh ................... H04L 12/189
714/758
(Continued)

FOREIGN PATENT DOCUMENTS

WO 2012 008611 1/2012

OTHER PUBLICATIONS

Bross, et al., "WD4: Working Draft 4 of High-Efficiency Video Coding", Joint Collaborative Team on Video Coding (JCT-VC) of ITU-T SG16 WP3 and ISO/IEC JTCI/SC29/WG11, No. JCTVC-F803. XP030009800, (Sep. 2011), (Total 216 pages).

(Continued)

*Primary Examiner* — Sath V Perungavoor
*Assistant Examiner* — Howard D Brown, Jr.
(74) *Attorney, Agent, or Firm* — Oblon, McClelland, Maier & Neustadt, L.L.P.

(57) ABSTRACT

A method encoding successive input data values includes: selecting one of plural complementary sub-ranges of a set of code values according to a current input data value, proportions of the sub-ranges relative to the set of code values defined by a context variable associated with that input data value; assigning the current input data value to a code value within the selected sub-range; modifying the set of code values based on the assigned code value and a size of the selected sub-range; detecting whether the set of code values is less than a predetermined minimum size and if so, successively increasing it until reaching the predetermined (Continued)

minimum size; outputting an encoded data bit in response to each size-increasing operation; modifying the context variable to increase the proportion of the set of code values in the sub-range selected; after encoding a group of input data values, terminating the output data.

16 Claims, 12 Drawing Sheets

(51) Int. Cl.

| | |
|---|---|
| *H03M 7/40* | (2006.01) |
| *H03M 7/42* | (2006.01) |
| *H04N 19/91* | (2014.01) |
| *H04N 19/88* | (2014.01) |
| *H04N 7/12* | (2006.01) |

(52) U.S. Cl.
CPC ............. *H04N 19/88* (2014.11); *H04N 19/91* (2014.11); *H04N 19/98* (2014.11)

(56) References Cited

U.S. PATENT DOCUMENTS

| | | | | |
|---|---|---|---|---|
| 2009/0044230 | A1* | 2/2009 | Oh ...................... | H04N 21/235 725/62 |
| 2010/0284456 | A1* | 11/2010 | Frank .................... | H04N 19/13 375/240.02 |
| 2011/0310966 | A1* | 12/2011 | Sankaran ............. | H04N 19/159 375/240.12 |
| 2012/0106652 | A1* | 5/2012 | Huang ................... | H04N 19/70 375/240.25 |
| 2013/0121423 | A1 | 5/2013 | Gamei et al. | |
| 2013/0128958 | A1 | 5/2013 | Gamei et al. | |
| 2014/0307807 | A1* | 10/2014 | Gamei ................ | H03M 7/4018 375/240.26 |
| 2015/0312588 | A1* | 10/2015 | Yamamoto ........... | H04N 19/105 375/240.15 |

OTHER PUBLICATIONS

Marpe, et al. Context-Based Adaptive Binary Arithmetic Coding in the H.264/AVC Video Compression Standard, IEEE Transactions on Circuits and Systems for Video Technology, vol. 13, No. 7. pp. 620-636, XP011099255, (Jul. 2003).

Sharman, et al. "CABAC Stream Termination", Joint Collaborative Team on Video Coding (JCT-VC) of ITU-T SG16 WP3 and ISO/IEC JTCI/SC29/WG11, No. JCTVC-G493 , (Total 4 pages), XP030110477, (Nov. 2011).

International Search Report issued Feb. 18, 2013 in PCT/GB12/052762 Filed Nov. 6, 2012.

U.S. Appl. No. 14/778,445, filed Sep. 18, 2015, Berry, et al.
U.S. Appl. No. 14/778,394, filed Sep. 18, 2015, Gamei,et al.
U.S. Appl. No. 14/779,502, Sep. 23, 2015, Berry,et al.

* cited by examiner

CONTEXT ADAPTIVE DATA ENCODING

CROSS REFERENCE TO RELATED APPLICATION

The present application claims the benefit of the earlier filing date of GB1119199.6 filed in the United Kingdom Intellectual Property Office on 7 Nov. 2011, the entire content of which application is incorporated herein by reference.

FIELD OF THE INVENTION

This invention relates to context adaptive data encoding.

DESCRIPTION OF THE RELATED ART

The "background" description provided herein is for the purpose of generally presenting the context of the disclosure. Work of the presently named inventors, to the extent it is described in this background section, as well as aspects of the description which may not otherwise qualify as prior art at the time of filing, are neither expressly or impliedly admitted as prior art against the present invention.

There are several video data compression and decompression systems which involve transforming video data into a frequency domain representation, quantising the frequency domain coefficients and then applying some form of entropy encoding to the quantised coefficients.

Entropy, in the present context, can be considered as representing the information content of a data symbol or series of symbols. The aim of entropy encoding is to encode a series of data symbols in a lossless manner using (ideally) the smallest number of encoded data bits which are necessary to represent the information content of that series of data symbols. In practice, entropy encoding is used to encode the quantised coefficients such that the encoded data is smaller (in terms of its number of bits) than the data size of the original quantised coefficients. A more efficient entropy encoding process gives a smaller output data size for the same input data size.

One technique for entropy encoding video data is the so-called CABAC (context adaptive binary arithmetic coding) technique. In an example implementation, the quantised coefficients are divided into data indicating positions, relative to an array of the coefficients, of coefficient values of certain magnitudes and their signs. So, for example, a so-called "significance map" may indicate positions in an array of coefficients where the coefficient at that position has a non-zero value. Other maps may indicate where the data has a value of one or more (and its sign); or where the data has a value of two or more.

In context adaptive encoding, a bit of data is encoded with respect to a probability model, or context, representing an expectation or prediction of how likely it is that the data bit will be a one or a zero. To do this, an input data bit is assigned a code value within one of two complementary sub-ranges of a range of code values, with the respective sizes of the sub-ranges being defined by the context. A next step is to modify the overall range (for use in respect of a next input data bit or value) in response to the assigned code value and the current size of the selected sub-range. If the modified range is then smaller than a threshold (for example, one half of an original range size) then it is increased in size, for example by doubling (shifting left) the modified range. At this point, an output encoded data bit is generated to indicate that a doubling operation took place. A further step is to modify the context for use with the next input data bit or value. In currently proposed systems this is carried out by using the current context and the identity of the current "most probable symbol" (either one or zero, whichever is indicated by the context to currently have a greater than 0.5 probability) as an index into a look-up table of new context values.

The CABAC process can provide an efficient encoding, particularly of quantised residual video data. At the end of the encoding process, however, there can be inefficiencies. Here, the "end" signifies the termination of stream or succession of encoded data, for example at the end of the encoding of a particular image region (such as a "slice" or a group of macroblocks arranged so as to represent a generally horizontal strip of an image). At the termination of the stream, which can occur many times per image, the encoder will retain a number of bits representing a current value of the assigned internal CABAC code value mentioned above. Previously proposed encoders may simply write this variable to the output data stream, so that there is an overhead of 8 bits (or whatever the size of the variable is) at each stream termination.

SUMMARY

This invention provides a data encoding method for encoding successive input data values, the method comprising the steps of:

selecting one of a plurality of complementary sub-ranges of a set of code values according to the value of a current input data value, the proportions of the sub-ranges relative to the set of code values being defined by a context variable associated with that input data value;

assigning the current input data value to a code value within the selected sub-range;

modifying the set of code values in dependence upon the assigned code value and the size of the selected sub-range;

detecting whether the set of code values is less than a predetermined minimum size and if so, successively increasing the size of the set of code values until it has at least the predetermined minimum size; and outputting an encoded data bit in response to each such size-increasing operation;

modifying the context variable, for use in respect of a next input data value, so as to increase the proportion of the set of code values in the sub-range which was selected for the current data value; and after encoding a group of input data values, terminating the output data by:

setting a value defining an end of the set of code values to a value having a plurality of least significant bits equal to zero;

increasing the size of the set of code values; and writing the value defining the end of the set of code values to the output data.

The invention also provides a data encoding apparatus for encoding successive input data values, the apparatus comprising:

means for selecting one of a plurality of complementary sub-ranges of a set of code values according to the value of a current input data value, the proportions of the sub-ranges relative to the set of code values being defined by a context variable associated with that input data value;

means for assigning the current input data value to a code value within the selected sub-range;

means for modifying the set of code values in dependence upon the assigned code value and the size of the selected sub-range;

means for detecting whether the set of code values is less than a predetermined minimum size and if so, successively increasing the size of the set of code values until it has at least the predetermined minimum size; and outputting an encoded data bit in response to each such size-increasing operation;

means for modifying the context variable, for use in respect of a next input data bit or value, so as to increase the proportion of the set of code values in the sub-range which was selected for the current data value; and after encoding a group of input data values, means for terminating the output data by:

setting a value defining an end of the set of code values to a value having a plurality of least significant bits equal to zero;

increasing the size of the set of code values; and writing the value defining the end of the set of code values to the output data.

The invention also provides a data decoding apparatus for decoding successive arithmetic-encoded data values, the apparatus comprising:

means for moving a read pointer back in an input data stream by a predetermined number of bit positions;

means for defining a range of a set of code values as zero;

means for setting, according to the value of a current input data value, the proportions of the sub-ranges relative to the set of code values being defined by a context variable associated with that input data value;

means for assigning the current input data value to a code value within the selected sub-range; and means for modifying the set of code values in dependence upon the assigned code value and the size of the selected sub-range.

Further respective aspects and features of the present invention are defined in the appended claims.

It is to be understood that both the foregoing general description of the invention and the following detailed description are exemplary, but not restrictive of, the invention.

BRIEF DESCRIPTION OF THE DRAWINGS

A more complete appreciation of the disclosure and many of the attendant advantages thereof will be readily obtained as the same becomes better understood by reference to the following detailed description of embodiments of the invention, when considered in connection with the accompanying drawings, wherein.

DESCRIPTION OF THE EMBODIMENTS

Figure 1:
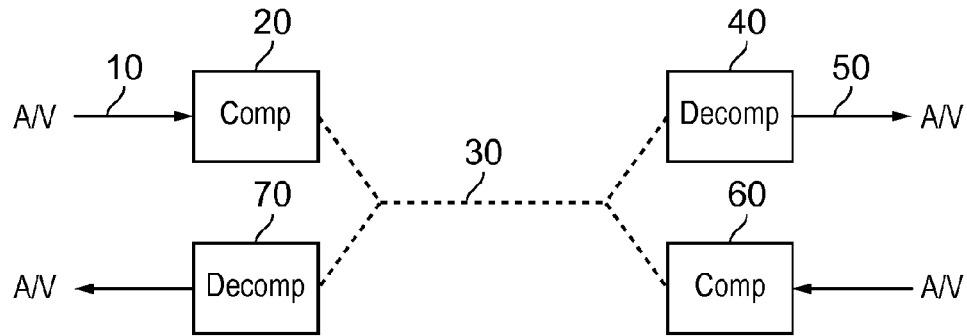
FIG. 1 schematically illustrates an audio/video (A/V) data transmission and reception system using video data compression and decompression.

Referring now to the drawings, FIGS. 1-4 are provided to give schematic illustrations of apparatus or systems making use of the compression and/or decompression apparatus to be described below in connection with embodiments of the invention.

All of the data compression and/or decompression apparatus is to be described below may be implemented in hardware, in software running on a general-purpose data processing apparatus such as a general-purpose computer, as programmable hardware such as an application specific integrated circuit (ASIC) or field programmable gate array (FPGA) or as combinations of these. In cases where the embodiments are implemented by software and/or firmware, it will be appreciated that such software and/or firmware, and non-transitory machine-readable data storage media by which such software and/or firmware are stored or otherwise provided, are considered as embodiments of the present invention.

FIG. 1 schematically illustrates an audio/video data transmission and reception system using video data compression and decompression.

An input audio/video signal 10 is supplied to a video data compression apparatus 20 which compresses at least the video component of the audio/video signal 10 for transmission along a transmission route 30 such as a cable, an optical fibre, a wireless link or the like. The compressed signal is processed by a decompression apparatus 40 to provide an output audio/video signal 50. For the return path, a compression apparatus 60 compresses an audio/video signal for transmission along the transmission route 30 to a decompression apparatus 70.

The compression apparatus 20 and decompression apparatus 70 can therefore form one node of a transmission link. The decompression apparatus 40 and decompression apparatus 60 can form another node of the transmission link. Of course, in instances where the transmission link is unidirectional, only one of the nodes would require a compression apparatus and the other node would only require a decompression apparatus.

Figure 2:
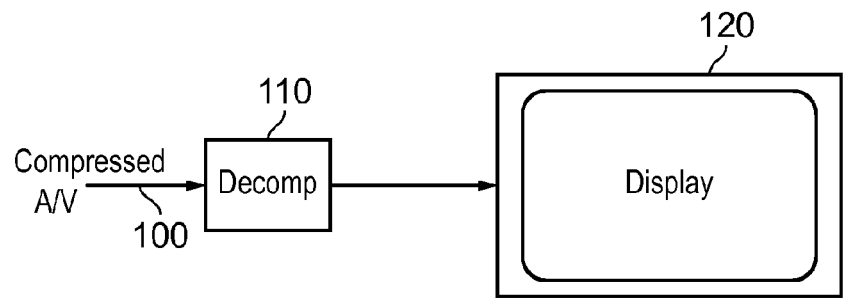
FIG. 2 schematically illustrates a video display system using video data decompression.

FIG. 2 schematically illustrates a video display system using video data decompression. In particular, a compressed audio/video signal 100 is processed by a decompression apparatus 110 to provide a decompressed signal which can be displayed on a display 120. The decompression apparatus 110 could be implemented as an integral part of the display 120, for example being provided within the same casing as the display device. Alternatively, the decompression apparatus 110 might be provided as (for example) a so-called set top box (STB), noting that the expression "set-top" does not imply a requirement for the box to be sited in any particular orientation or position with respect to the display 120; it is simply a term used in the art to indicate a device which is connectable to a display as a peripheral device.

Figure 3:
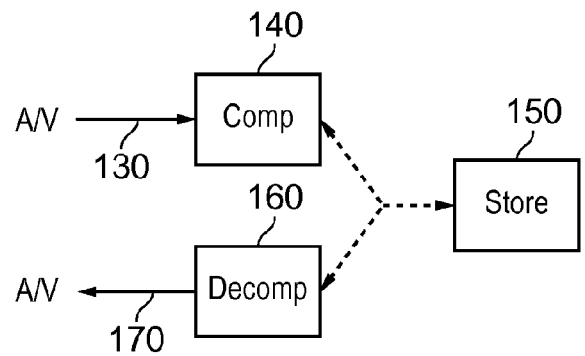
FIG. 3 schematically illustrates an audio/video storage system using video data compression and decompression.

FIG. 3 schematically illustrates an audio/video storage system using video data compression and decompression. An input audio/video signal 130 is supplied to a compression apparatus 140 which generates a compressed signal for storing by a store device 150 such as a magnetic disk device, an optical disk device, a magnetic tape device, a solid state storage device such as a semiconductor memory or other storage device. For replay, compressed data is read from the store device 150 and passed to a decompression apparatus 160 for decompression to provide an output audio/video signal 170.

It will be appreciated that the compressed or encoded signal, and a storage medium or data carrier storing that signal, are considered as embodiments of the present invention.

Figure 4:
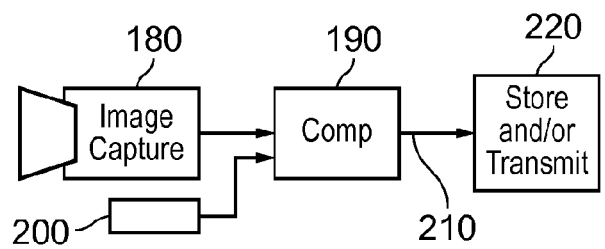
FIG. 4 schematically illustrates a video camera using video data compression.

FIG. 4 schematically illustrates a video camera using video data compression. In FIG. 4, and image capture device 180, such as a charge coupled device (CCD) image sensor and associated control and read-out electronics, generates a video signal which is passed to a compression apparatus 190. A microphone (or plural microphones) 200 generates an audio signal to be passed to the compression apparatus 190. The compression apparatus 190 generates a compressed audio/video signal 210 to be stored and/or transmitted (shown generically as a schematic stage 220).

The techniques to be described below relate primarily to video data compression. It will be appreciated that many existing techniques may be used for audio data compression in conjunction with the video data compression techniques which will be described, to generate a compressed audio/video signal. Accordingly, a separate discussion of audio data compression will not be provided. It will also be appreciated that the data rate associated with video data, in particular broadcast quality video data, is generally very much higher than the data rate associated with audio data (whether compressed or uncompressed). It will therefore be appreciated that uncompressed audio data could accompany compressed video data to form a compressed audio/video signal. It will further be appreciated that although the present examples (shown in FIGS. 1-4) relate to audio/video data, the techniques to be described below can find use in a system which simply deals with (that is to say, compresses, decompresses, stores, displays and/or transmits) video data. That is to say, the embodiments can apply to video data compression without necessarily having any associated audio data handling at all.

Figure 5:
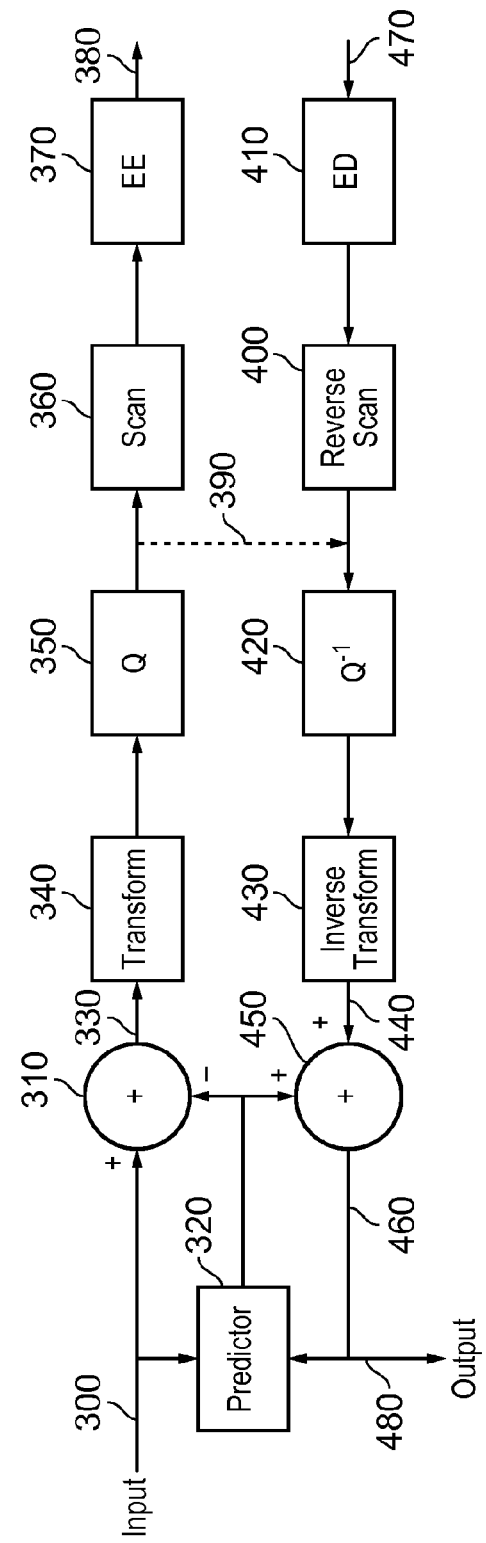
FIG. 5 provides a schematic overview of a video data compression and decompression apparatus.

FIG. 5 provides a schematic overview of a video data compression and decompression apparatus.

Successive images of an input video signal 300 are supplied to an adder 310 and to an image predictor 320. The image predictor 320 will be described below in more detail with reference to FIG. 6. The adder 310 in fact performs a subtraction (negative addition) operation, in that it receives the input video signal 300 on a "+" input and the output of the image predictor 320 on a "−" input, so that the predicted image is subtracted from the input image. The result is to generate a so-called residual image signal 330 representing the difference between the actual and projected images.

One reason why a residual image signal is generated is as follows. The data coding techniques to be described, that is to say the techniques which will be applied to the residual image signal, tends to work more efficiently when there is less "energy" in the image to be encoded. Here, the term "efficiently" refers to the generation of a small amount of encoded data; for a particular image quality level, it is desirable (and considered "efficient") to generate as little data as is practicably possible. The reference to "energy" in the residual image relates to the amount of information contained in the residual image. If the predicted image were to be identical to the real image, the difference between the two (that is to say, the residual image) would contain zero information (zero energy) and would be very easy to encode into a small amount of encoded data. In general, if the prediction process can be made to work reasonably well, the expectation is that the residual image data will contain less information (less energy) than the input image and so will be easier to encode into a small amount of encoded data.

The residual image data 330 is supplied to a transform unit 340 which generates a discrete cosine transform (DCT) representation of the residual image data. The DCT technique itself is well known and will not be described in detail here. There are however aspects of the techniques used in the present apparatus which will be described in more detail below, in particular relating to the selection of different blocks of data to which the DCT operation is applied. These will be discussed with reference to FIGS. 7-12 below.

The output of the transform unit 340, which is to say, a set of DCT coefficients for each transformed block of image data, is supplied to a quantiser 350. Various quantisation techniques are known in the field of video data compression, ranging from a simple multiplication by a quantisation scaling factor through to the application of complicated lookup tables under the control of a quantisation parameter. The general aim is twofold. Firstly, the quantisation process reduces the number of possible values of the transformed data. Secondly, the quantisation process can increase the likelihood that values of the transformed data are zero. Both of these can make the entropy encoding process, to be described below, work more efficiently in generating small amounts of compressed video data.

A data scanning process is applied by a scan unit 360. The purpose of the scanning process is to reorder the quantised transformed data so as to gather as many as possible of the non-zero quantised transformed coefficients together, and of course therefore to gather as many as possible of the zero-valued coefficients together. These features can allow so-called run-length coding or similar techniques to be applied efficiently. So, the scanning process involves selecting coefficients from the quantised transformed data, and in particular from a block of coefficients corresponding to a block of image data which has been transformed and quantised, according to a "scanning order" so that (a) all of the coefficients are selected once as part of the scan, and (b) the scan tends to provide the desired reordering. Techniques for selecting a scanning order will be described below. One example scanning order which can tend to give useful results is a so-called zigzag scanning order.

The scanned coefficients are then passed to an entropy encoder (EE) 370. Again, various types of entropy encoding may be used. Two examples which will be described below are variants of the so-called CABAC (Context Adaptive Binary Arithmetic Coding) system and variants of the so-called CAVLC (Context Adaptive Variable-Length Coding) system. In general terms, CABAC is considered to provide a better efficiency, and in some studies has been shown to provide a 10-20% reduction in the quantity of encoded output data for a comparable image quality compared to CAVLC. However, CAVLC is considered to represent a much lower level of complexity (in terms of its implementation) than CABAC. The CABAC technique will be discussed with reference to FIG. 17 below, and the CAVLC technique will be discussed with reference to FIGS. 18 and 19 below.

Note that the scanning process and the entropy encoding process are shown as separate processes, but in fact can be combined or treated together. That is to say, the reading of data into the entropy encoder can take place in the scan order. Corresponding considerations apply to the respective inverse processes to be described below.

The output of the entropy encoder 370, along with additional data (mentioned above and/or discussed below), for example defining the manner in which the predictor 320 generated the predicted image, provides a compressed output video signal 380.

However, a return path is also provided because the operation of the predictor 320 itself depends upon a decompressed version of the compressed output data.

The reason for this feature is as follows. At the appropriate stage in the decompression process (to be described below) a decompressed version of the residual data is generated. This decompressed residual data has to be added to a predicted image to generate an output image (because the original residual data was the difference between the input image and a predicted image). In order that this process is comparable, as between the compression side and the decompression side, the predicted images generated by the predictor 320 should be the same during the compression process and during the decompression process. Of course, at decompression, the apparatus does not have access to the original input images, but only to the decompressed images. Therefore, at compression, the predictor 320 bases its prediction (at least, for inter-image encoding) on decompressed versions of the compressed images.

The entropy encoding process carried out by the entropy encoder 370 is considered to be "lossless", which is to say that it can be reversed to arrive at exactly the same data which was first supplied to the entropy encoder 370. So, the return path can be implemented before the entropy encoding stage. Indeed, the scanning process carried out by the scan unit 360 is also considered lossless, but in the present embodiment the return path 390 is from the output of the quantiser 350 to the input of a complimentary inverse quantiser 420.

In general terms, an entropy decoder 410, the reverse scan unit 400, an inverse quantiser 420 and an inverse transform unit 430 provide the respective inverse functions of the entropy encoder 370, the scan unit 360, the quantiser 350 and the transform unit 340. For now, the discussion will continue through the compression process; the process to decompress an input compressed video signal will be discussed separately below.

In the compression process, the scanned coefficients are passed by the return path 390 from the quantiser 350 to the inverse quantiser 420 which carries out the inverse operation of the scan unit 360. An inverse quantisation and inverse transformation process are carried out by the units 420, 430 to generate a compressed-decompressed residual image signal 440.

The image signal 440 is added, at an adder 450, to the output of the predictor 320 to generate a reconstructed output image 460. This forms one input to the image predictor 320, as will be described below.

Turning now to the process applied to a received compressed video signal 470, the signal is supplied to the entropy decoder 410 and from there to the chain of the reverse scan unit 400, the inverse quantiser 420 and the inverse transform unit 430 before being added to the output of the image predictor 320 by the adder 450. In straightforward terms, the output 460 of the adder 450 forms the output decompressed video signal 480. In practice, further filtering may be applied before the signal is output.

Figure 6:
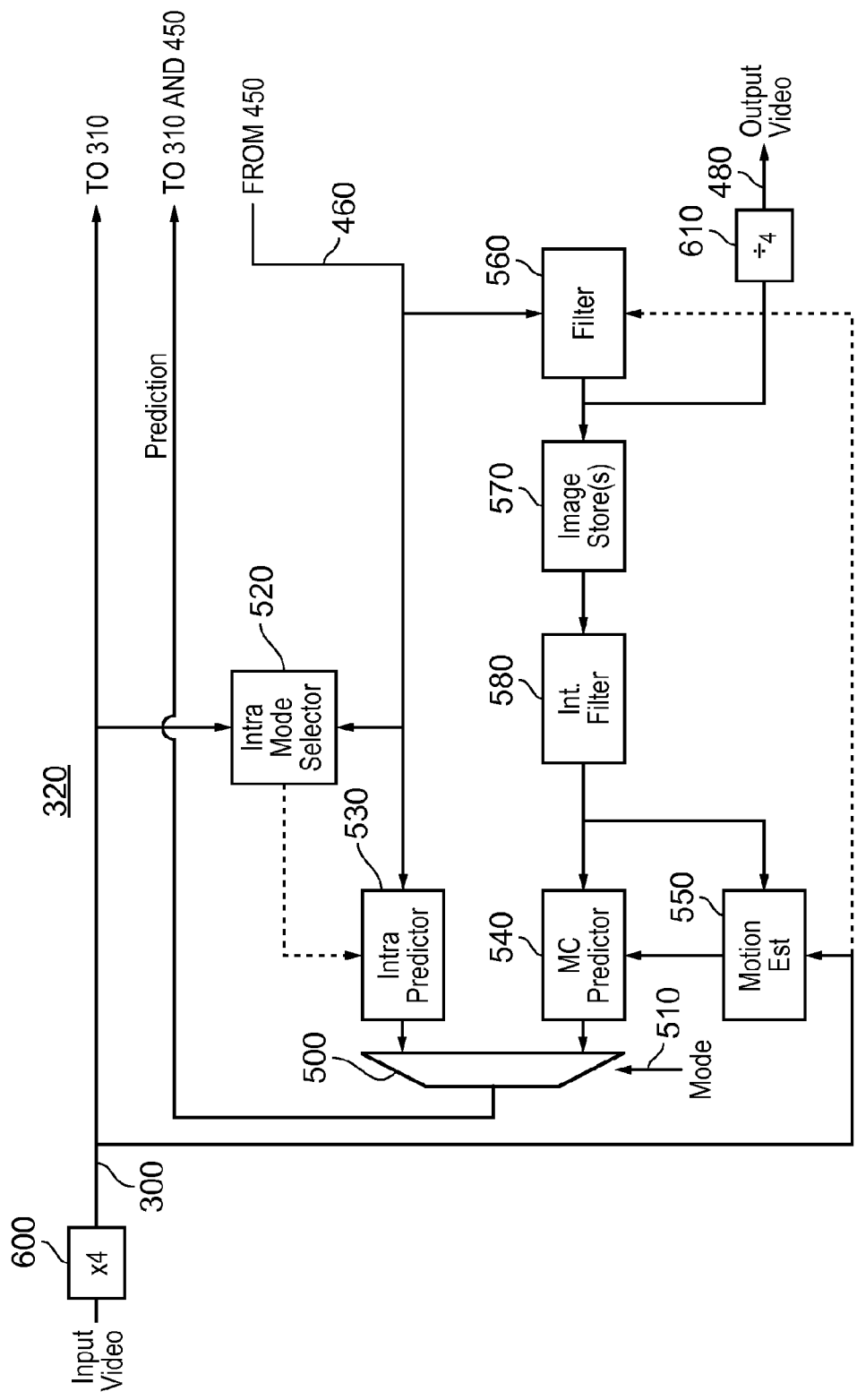
FIG. 6 schematically illustrates the generation of predicted images.
Figure 7:
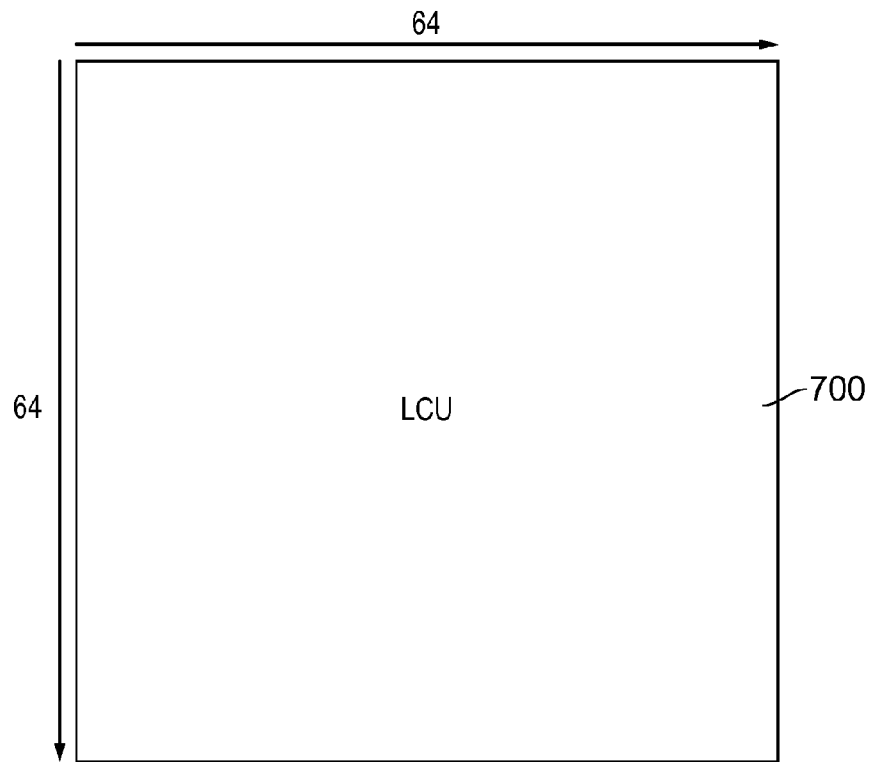
FIG. 7 schematically illustrates a largest coding unit (LCU)

FIG. 6 schematically illustrates the generation of predicted images, and in particular the operation of the image predictor 320.

There are two basic modes of prediction: so-called intra-image prediction and so-called inter-image, or motion-compensated (MC), prediction.

Intra-image prediction bases a prediction of the content of a block of the image on data from within the same image. This corresponds to so-called I-frame encoding in other video compression techniques. In contrast to I-frame encoding, where the whole image is intra-encoded, in the present embodiments the choice between intra- and inter-encoding can be made on a block-by-block basis, though in other embodiments of the invention the choice is still made on an image-by-image basis.

Motion-compensated prediction makes use of motion information which attempts to define the source, in another adjacent or nearby image, of image detail to be encoded in the current image. Accordingly, in an ideal example, the contents of a block of image data in the predicted image can be encoded very simply as a reference (a motion vector) pointing to a corresponding block at the same or a slightly different position in an adjacent image.

Returning to FIG. 6, two image prediction arrangements (corresponding to intra- and inter-image prediction) are shown, the results of which are selected by a multiplexer 500 under the control of a mode signal 510 so as to provide blocks of the predicted image for supply to the adders 310 and 450. The choice is made in dependence upon which selection gives the lowest "energy" (which, as discussed above, may be considered as information content requiring encoding), and the choice is signalled to the encoder within the encoded output datastream. Image energy, in this context, can be detected, for example, by carrying out a trial subtraction of an area of the two versions of the predicted image from the input image, squaring each pixel value of the difference image, summing the squared values, and identifying which of the two versions gives rise to the lower mean squared value of the difference image relating to that image area.

The actual prediction, in the intra-encoding system, is made on the basis of image blocks received as part of the signal 460, which is to say, the prediction is based upon encoded-decoded image blocks in order that exactly the same prediction can be made at a decompression apparatus. However, data can be derived from the input video signal 300 by an intra-mode selector 520 to control the operation of the intra-image predictor 530.

For inter-image prediction, a motion compensated (MC) predictor 540 uses motion information such as motion vectors derived by a motion estimator 550 from the input video signal 300. Those motion vectors are applied to a processed version of the reconstructed image 460 by the motion compensated predictor 540 to generate blocks of the inter-image prediction.

The processing applied to the signal 460 will now be described. Firstly, the signal is filtered by a filter unit 560. This involves applying a "deblocking" filter to remove or at least tend to reduce the effects of the block-based processing carried out by the transform unit 340 and subsequent operations. Also, an adaptive loop filter is applied using coefficients derived by processing the reconstructed signal 460 and the input video signal 300. The adaptive loop filter is a type of filter which, using known techniques, applies adaptive filter coefficients to the data to be filtered. That is to say, the filter coefficients can vary in dependence upon various factors. Data defining which filter coefficients to use is included as part of the encoded output datastream.

The filtered output from the filter unit 560 in fact forms the output video signal 480. It is also buffered in one or more image stores 570; the storage of successive images is a requirement of motion compensated prediction processing, and in particular the generation of motion vectors. To save on storage requirements, the stored images in the image stores 570 may be held in a compressed form and then decompressed for use in generating motion vectors. For this particular purpose, any known compression/decompression system may be used. The stored images are passed to an interpolation filter 580 which generates a higher resolution version of the stored images; in this example, intermediate samples (sub-samples) are generated such that the resolution of the interpolated image is output by the interpolation filter 580 is 8 times (in each dimension) that of the images stored in the image stores 570. The interpolated images are passed as an input to the motion estimator 550 and also to the motion compensated predictor 540.

In embodiments of the invention, a further optional stage is provided, which is to multiply the data values of the input video signal by a factor of four using a multiplier 600 (effectively just shifting the data values left by two bits), and to apply a corresponding divide operation (shift right by two bits) at the output of the apparatus using a divider or right-shifter 610. So, the shifting left and shifting right changes the data purely for the internal operation of the apparatus. This measure can provide for higher calculation accuracy within the apparatus, as the effect of any data rounding errors is reduced.

The way in which an image is partitioned for compression processing will now be described. At a basic level, and image to be compressed is considered as an array of blocks of samples. For the purposes of the present discussion, the largest such block under consideration is a so-called largest coding unit (LCU) 700 (FIG. 7), which represents a square array of 64×64 samples. Here, the discussion relates to luminance samples. Depending on the chrominance mode, such as 4:4:4, 4:2:2, 4:2:0 or 4:4:4:4 (GBR plus key data), there will be differing numbers of corresponding chrominance samples corresponding to the luminance block.

Three basic types of blocks will be described: coding units, prediction units and transform units. In general terms, the recursive subdividing of the LCUs allows an input picture to be partitioned in such a way that both the block sizes and the block coding parameters (such as prediction or residual coding modes) can be set according to the specific characteristics of the image to be encoded.

Figure 8:
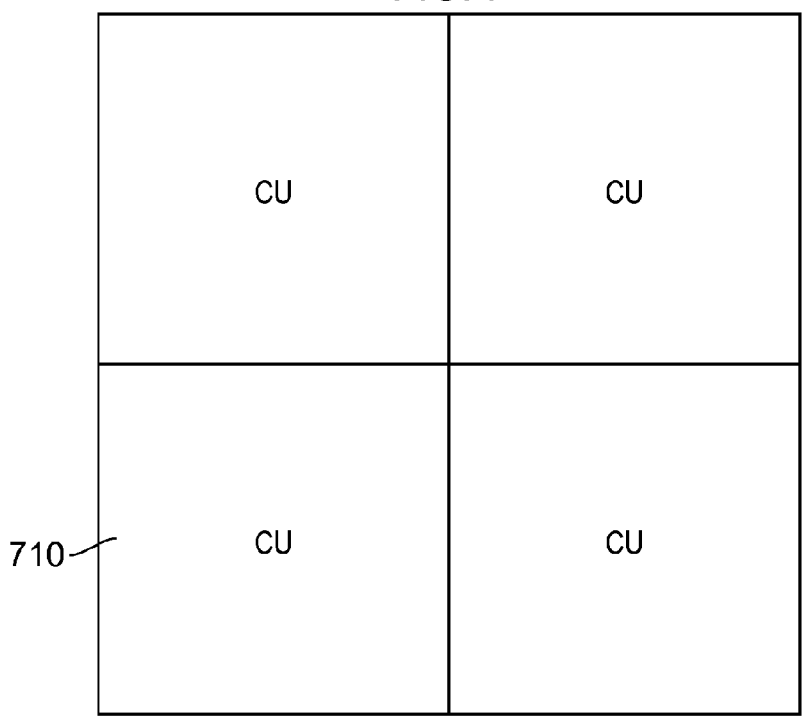
FIG. 8 schematically illustrates a set of four coding units (CU)
Figure 9:
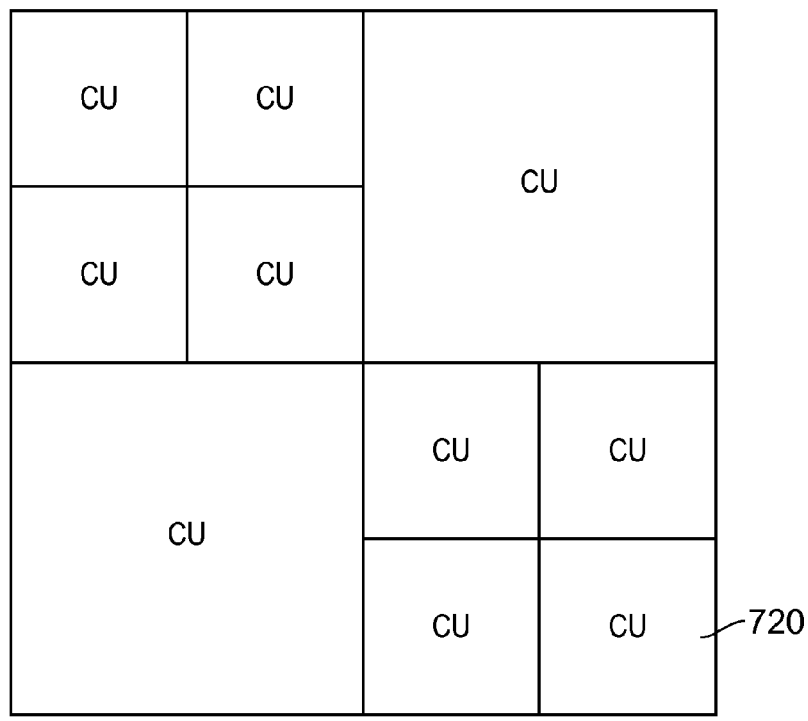
FIGS. 9 and 10 schematically illustrate the coding units of FIG. 8 sub-divided into smaller coding units.
Figure 10:
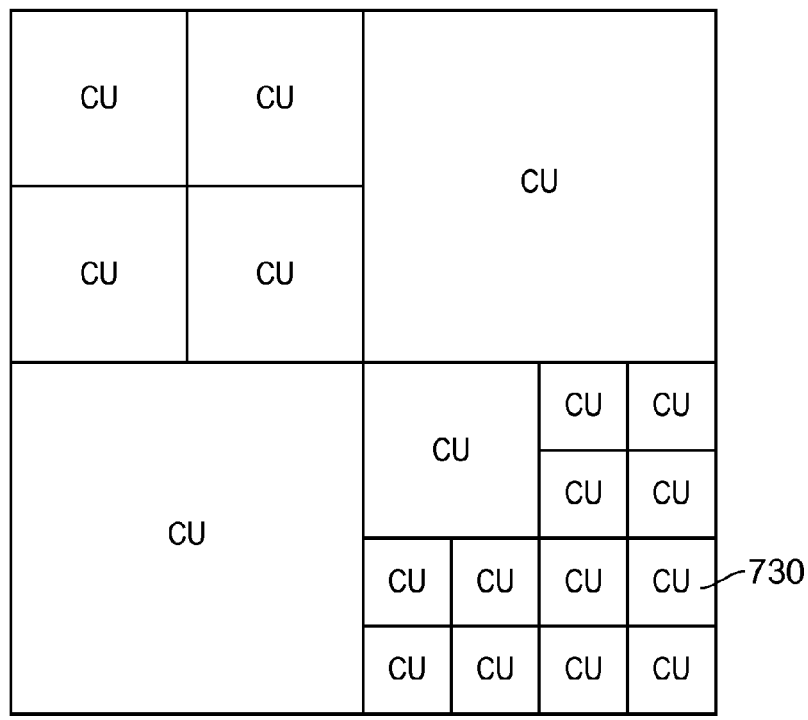

The LCU may be subdivided into so-called coding units (CU). Coding units are always square and have a size between 8×8 samples and the full size of the LCU 700. The coding units can be arranged as a kind of tree structure, so that a first subdivision may take place as shown in FIG. 8, giving coding units 710 of 32×32 samples; subsequent subdivisions may then take place on a selective basis so as to give some coding units 720 of 16×16 samples (FIG. 9) and potentially some coding units 730 of 8×8 samples (FIG. 10). Overall, this process can provide a content-adapting coding tree structure of CU blocks, each of which may be as large as the LCU or as small as 8×8 samples. Encoding of the output video data takes place on the basis of the coding unit structure.

Figure 11:
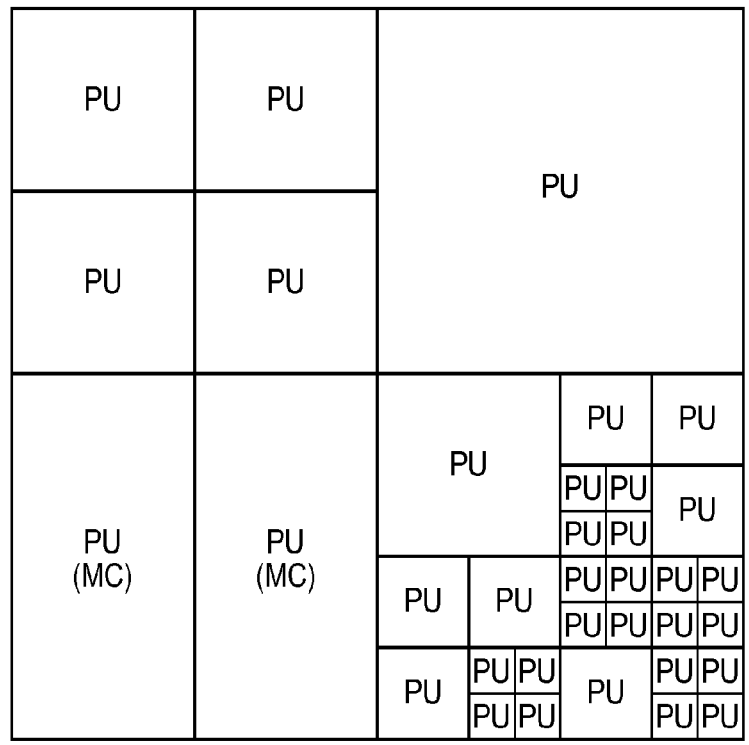
FIG. 11 schematically illustrates an array of prediction units (PU)

FIG. 11 schematically illustrates an array of prediction units (PU). A prediction unit is a basic unit for carrying information relating to the image prediction processes, or in other words the additional data added to the entropy encoded residual image data to form the output video signal from the apparatus of FIG. 5. In general, prediction units are not restricted to being square in shape. They can take other shapes, in particular rectangular shapes forming half of one of the square coding units, as long as the coding unit is greater than the minimum (8×8) size. The aim is to allow the boundary of adjacent prediction units to match (as closely as possible) the boundary of real objects in the picture, so that different prediction parameters can be applied to different real objects. Each coding unit may contain one or more prediction units.

Figure 12:
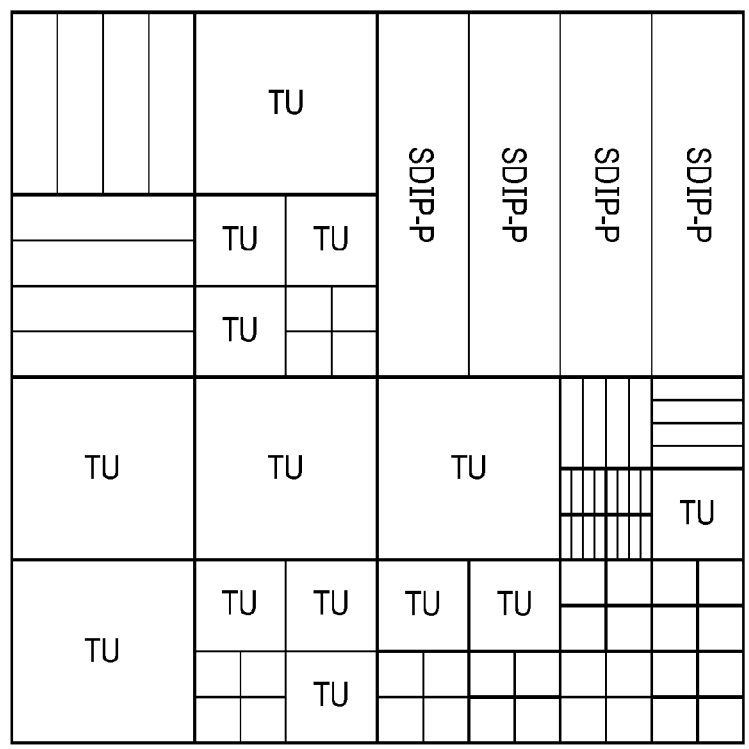
FIG. 12 schematically illustrates an array of transform units (TU)

FIG. 12 schematically illustrates an array of transform units (TU). A transform unit is a basic unit of the transform and quantisation process. Transform units are always square and can take a size from 4×4 up to 32×32 samples. Each coding unit can contain one or more transform units. The acronym SDIP-P in FIG. 12 signifies a so-called short distance intra-prediction partition. In this arrangement only one dimensional transforms are used, so a 4×N block is passed through N transforms with input data to the transforms being based upon the previously decoded neighbouring blocks and the previously decoded neighbouring lines within the current SDIP-P.

Figure 13:
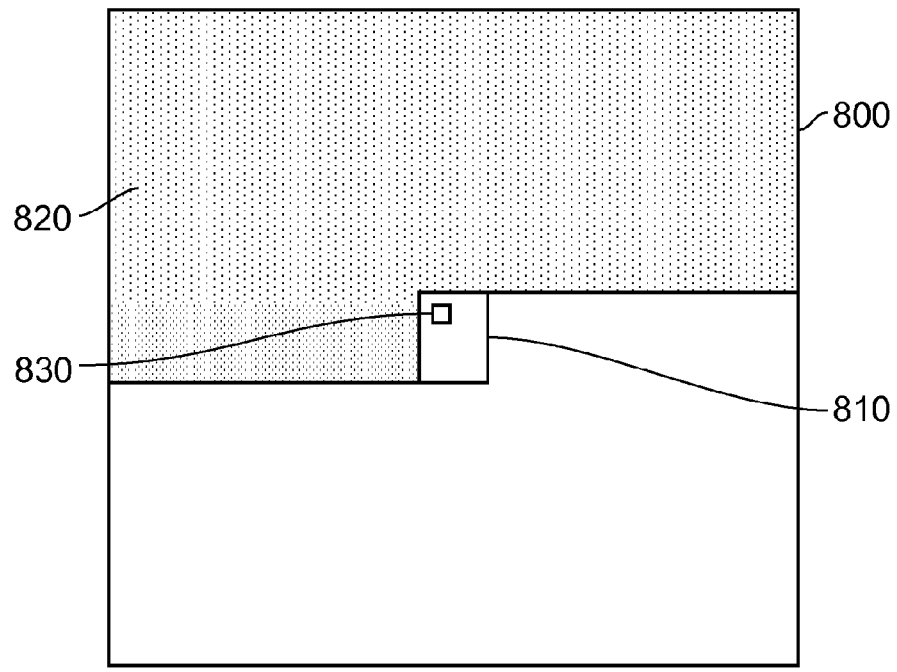
FIG. 13 schematically illustrates a partially-encoded image.

The intra-prediction process will now be discussed. In general terms, intra-prediction involves generating a prediction of a current block (a prediction unit) of samples from previously-encoded and decoded samples in the same image. FIG. 13 schematically illustrates a partially encoded image 800. Here, the image is being encoded from top-left to bottom-right on an LCU basis. An example LCU encoded partway through the handling of the whole image is shown as a block 810. A shaded region 820 above and to the left of the block 810 has already been encoded. The intra-image prediction of the contents of the block 810 can make use of any of the shaded area 820 but cannot make use of the unshaded area below that.

The block 810 represents an LCU; as discussed above, for the purposes of intra-image prediction processing, this may be subdivided into a set of smaller prediction units. An example of a prediction unit 830 is shown within the LCU 810.

The intra-image prediction takes into account samples above and/or to the left of the current LCU 810. Source samples, from which the required samples are predicted, may be located at different positions or directions relative to a current prediction unit within the LCU 810. To decide which direction is appropriate for a current prediction unit, the results of a trial prediction based upon each candidate direction are compared in order to see which candidate direction gives an outcome which is closest to the corresponding block of the input image. The candidate direction giving the closest outcome is selected as the prediction direction for that prediction unit.

The picture may also be encoded on a "slice" basis. In one example, a slice is a horizontally adjacent group of LCUs. But in more general terms, the entire residual image could form a slice, or a slice could be a single LCU, or a slice could be a row of LCUs, and so on. Slices can give some resilience to errors as they are encoded as independent units. The encoder and decoder states are completely reset at a slice boundary. For example, intra-prediction is not carried out across slice boundaries; slice boundaries are treated as image boundaries for this purpose.

Figure 14:
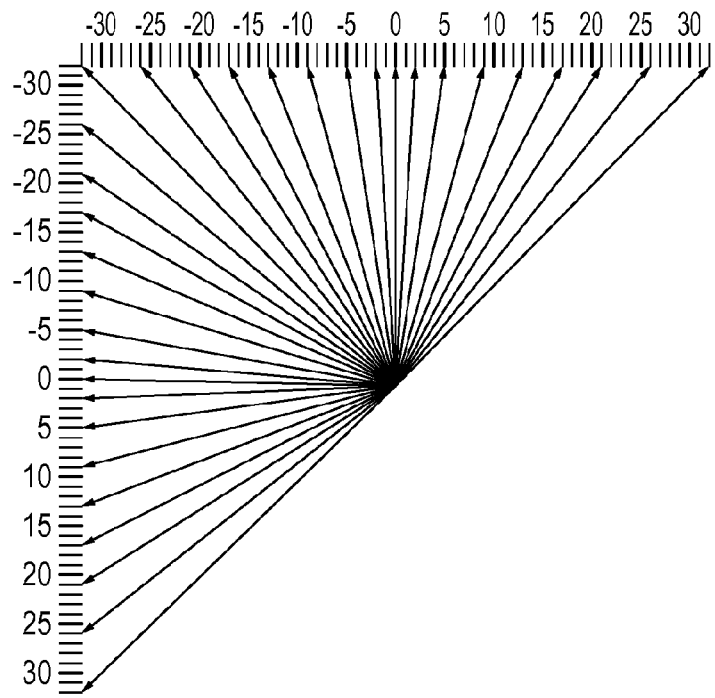
FIG. 14 schematically illustrates a set of possible prediction directions.
Figure 15:
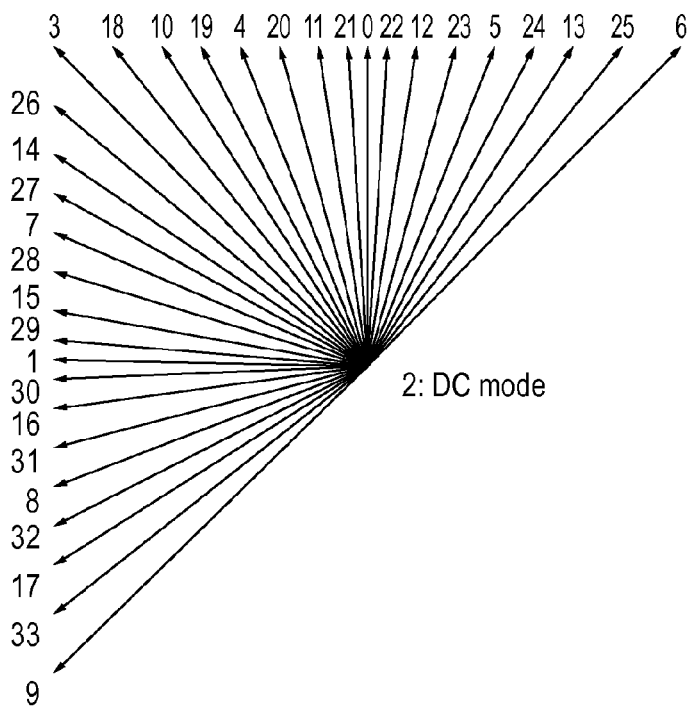
FIG. 15 schematically illustrates a set of prediction modes.

FIG. 14 schematically illustrates a set of possible (candidate) prediction directions. The full set of 34 candidate directions is available to a prediction unit of 8×8, 16×16 or 32×32 samples. The special cases of prediction unit sizes of 4×4 and 64×64 samples have a reduced set of candidate directions available to them (17 candidate directions and 5 candidate directions respectively). The directions are determined by horizontal and vertical displacement relative to a current block position, but are encoded as prediction "modes", a set of which is shown in FIG. 15. Note that the so-called DC mode represents a simple arithmetic mean of the surrounding upper and left-hand samples.

Figure 16:
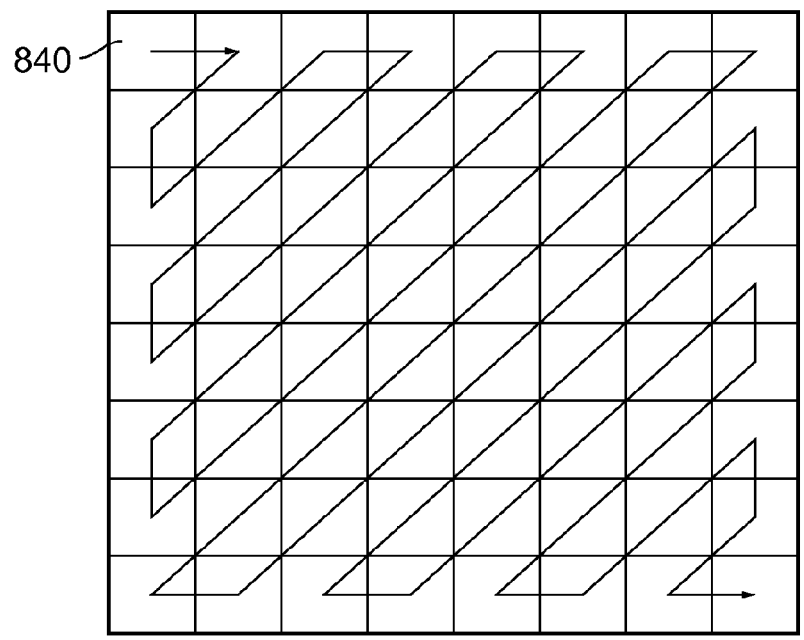
FIG. 16 schematically illustrates a zigzag scan.

FIG. 16 schematically illustrates a zigzag scan, being a scan pattern which may be applied by the scan unit 360. In FIG. 16, the pattern is shown for an example block of 8×8 DCT coefficients, with the DC coefficient being positioned at the top left position 840 of the block, and increasing horizontal and vertical spatial frequencies being represented by coefficients at increasing distances downwards and to the right of the top-left position 840.

Note that in some embodiments, the coefficients may be scanned in a reverse order (bottom right to top left using the ordering notation of FIG. 16). Also it should be noted that in some embodiments, the scan may pass from left to right across a few (for example between one and three) uppermost horizontal rows, before carrying out a zig-zag of the remaining coefficients.

Figure 17:
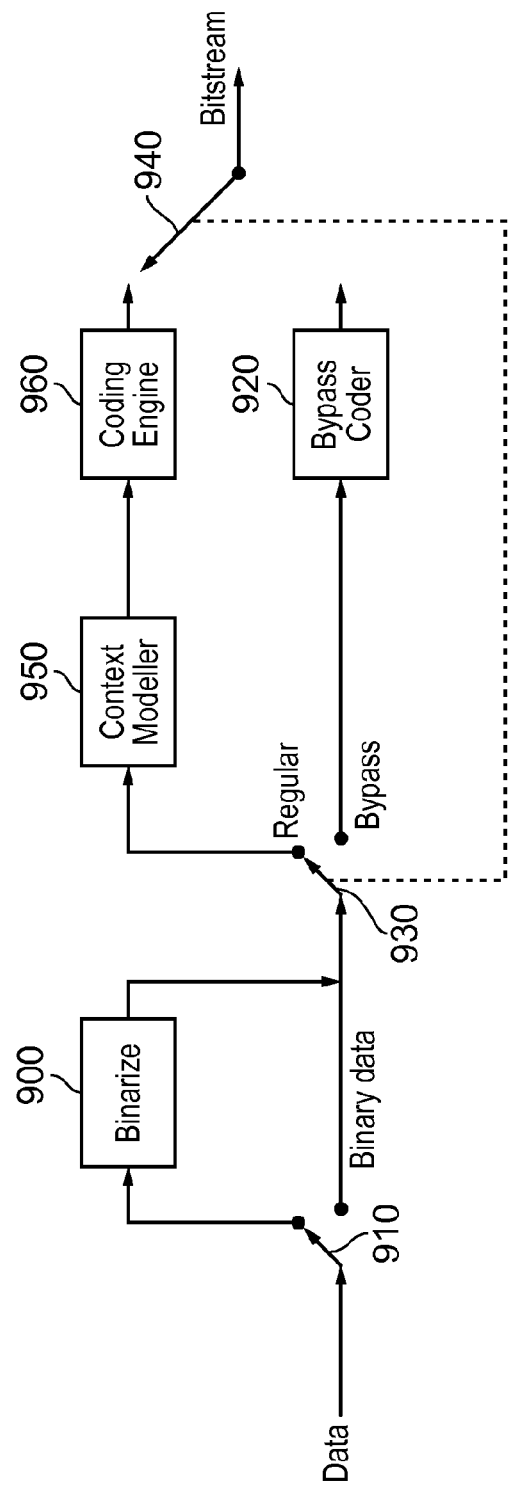
FIG. 17 schematically illustrates a CABAC entropy encoder.

FIG. 17 schematically illustrates the operation of a CABAC entropy encoder.

In context adaptive encoding of this nature and according to embodiments of the invention, a bit of data may be encoded with respect to a probability model, or context, representing an expectation or prediction of how likely it is that the data bit will be a one or a zero. To do this, an input data bit is assigned a code value within a selected one of two (or more generally, a plurality of) complementary sub-ranges of a range of code values, with the respective sizes of the sub-ranges (in embodiments of the invention, the respective proportions of the sub-ranges relative to the set of code values) being defined by the context (which in turn is defined by a context variable associated with or otherwise relevant to that input value). A next step is to modify the overall range, which is to say, the set of code values, (for use in respect of a next input data bit or value) in response to the assigned code value and the current size of the selected sub-range. If the modified range is then smaller than a threshold representing a predetermined minimum size (for example, one half of an original range size) then it is increased in size, for example by doubling (shifting left) the modified range, which doubling process can be carried out successively (more than once) if required, until the range has at least the predetermined minimum size. At this point, an output encoded data bit is generated to indicate that a (or each, if more than one) doubling or size-increasing operation took place. A further step is to modify the context (that is, in embodiments of the invention, to modify the context variable) for use with or in respect of the next input data bit or value (or, in some embodiments, in respect of a next group of data bits or values to be encoded). This may be carried out by using the current context and the identity of the current "most probable symbol" (either one or zero, whichever is indicated by the context to currently have a greater than 0.5 probability) as an index into a look-up table of new context values, or as inputs to an appropriate mathematical formula from which a new context variable may be derived. The modification of the context variable may, in embodiments of the invention, increase the proportion of the set of code values in the sub-range which was selected for the current data value.

The CABAC encoder operates in respect of binary data, that is to say, data represented by only the two symbols 0 and 1. The encoder makes use of a so-called context modelling process which selects a "context" or probability model for subsequent data on the basis of previously encoded data. The selection of the context is carried out in a deterministic way so that the same determination, on the basis of previously decoded data, can be performed at the decoder without the need for further data (specifying the context) to be added to the encoded datastream passed to the decoder.

Referring to FIG. 17, input data to be encoded may be passed to a binary converter 900 if it is not already in a binary form; if the data is already in binary form, the converter 900 is bypassed (by a schematic switch 910). In the present embodiments, conversion to a binary form is actually carried out by expressing the quantised DCT coefficient data as a series of binary "maps", which will be described further below.

The binary data may then be handled by one of two processing paths, a "regular" and a "bypass" path (which are shown schematically as separate paths but which, in embodiments of the invention discussed below, could in fact be implemented by the same processing stages, just using slightly different parameters). The bypass path employs a so-called bypass coder 920 which does not necessarily make use of context modelling in the same form as the regular path. In some examples of CABAC coding, this bypass path can be selected if there is a need for particularly rapid processing of a batch of data, but in the present embodiments two features of so-called "bypass" data are noted: firstly, the bypass data is handled by the CABAC encoder (950, 960), just using a fixed context model representing a 50% probability; and secondly, the bypass data relates to certain categories of data, one particular example being coefficient sign data. Otherwise, the regular path is selected by schematic switches 930, 940. This involves the data being processed by a context modeller 950 followed by a coding engine 960.

The entropy encoder shown in FIG. 17 encodes a block of data (that is, for example, data corresponding to a block of coefficients relating to a block of the residual image) as a single value if the block is formed entirely of zero-valued data. For each block that does not fall into this category, that is to say a block that contains at least some non-zero data, a "significance map" is prepared. The significance map indicates whether, for each position in a block of data to be encoded, the corresponding coefficient in the block is non-zero. The significance map data, being in binary form, is itself CABAC encoded. The use of the significance map assists with compression because no data needs to be encoded for a coefficient with a magnitude that the significance map indicates to be zero. Also, the significance map can include a special code to indicate the final non-zero coefficient in the block, so that all of the final high frequency/trailing zero coefficients can be omitted from the encoding. The significance map is followed, in the encoded bitstream, by data defining the values of the non-zero coefficients specified by the significance map.

Further levels of map data are also prepared and are CABAC encoded. An example is a map which defines, as a binary value (1=yes, 0=no) whether the coefficient data at a map position which the significance map has indicated to be "non-zero" actually has the value of "one". Another map specifies whether the coefficient data at a map position which the significance map has indicated to be "non-zero" actually has the value of "two". A further map indicates, for those map positions where the significance map has indicated that the coefficient data is "non-zero", whether the data has a value of "greater than two". Another map indicates, again for data identified as "non-zero", the sign of the data value (using a predetermined binary notation such as 1 for +, 0 for −, or of course the other way around).

In embodiments of the invention, the significance map and other maps are generated from the quantised DCT coefficients, for example by the scan unit 360, and is subjected to a zigzag scanning process (or a scanning process selected from zigzag, horizontal raster and vertical raster scanning according to the intra-prediction mode) before being subjected to CABAC encoding.

In general terms, CABAC encoding involves predicting a context, or a probability model, for a next bit to be encoded, based upon other previously encoded data. If the next bit is the same as the bit identified as "most likely" by the probability model, then the encoding of the information that "the next bit agrees with the probability model" can be encoded with great efficiency. It is less efficient to encode that "the next bit does not agree with the probability model", so the derivation of the context data is important to good operation of the encoder. The term "adaptive" means that the context or probability models are adapted, or varied during encoding, in an attempt to provide a good match to the (as yet uncoded) next data.

Using a simple analogy, in the written English language, the letter "U" is relatively uncommon. But in a letter position immediately after the letter "Q", it is very common indeed. So, a probability model might set the probability of a "U" as a very low value, but if the current letter is a "Q", the probability model for a "U" as the next letter could be set to a very high probability value.

CABAC encoding is used, in the present arrangements, for at least the significance map and the maps indicating whether the non-zero values are one or two. Bypass processing—which in these embodiments is identical to CABAC encoding but for the fact that the probability model is fixed at an equal (0.5:0.5) probability distribution of 1s and 0s, is used for at least the sign data and the map indicating whether a value is >2. For those data positions identified as >2, a separate so-called escape data encoding can be used to encode the actual value of the data. This may include a Golomb-Rice encoding technique.

The CABAC context modelling and encoding process is described in more detail in WD4: Working Draft 4 of High-Efficiency Video Coding, JCTVC-F803_d5, Draft ISO/IEC 23008-HEVC; 201x(E) 2011-10-28.

Figure 18:
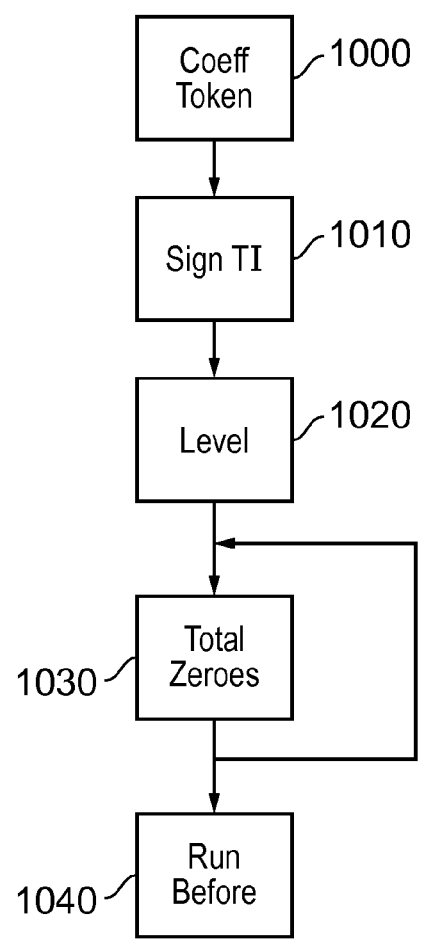
FIG. 18 schematically illustrates a CAVLC entropy encoding process.
Figure 19:
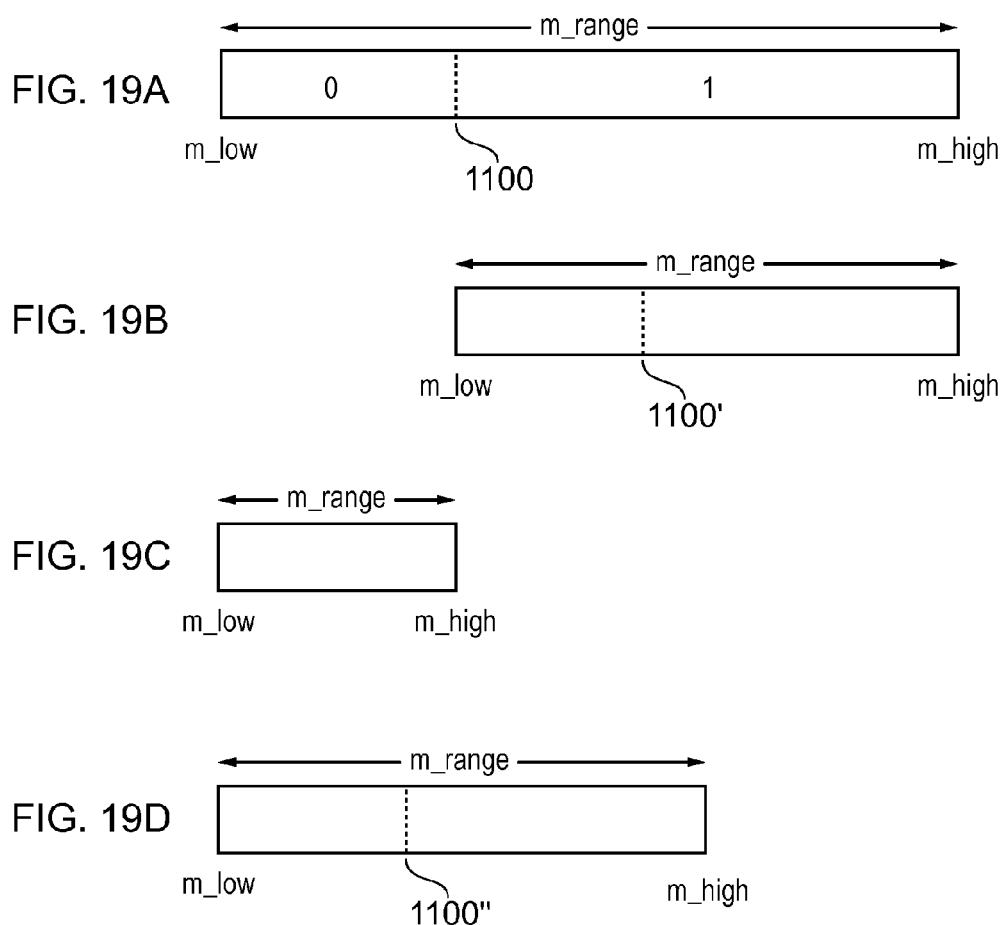
FIGS. 19A to 19D schematically illustrate aspects of a CABAC encoding and decoding operation.

FIG. 18 schematically illustrates a CAVLC entropy encoding process.

As with CABAC discussed above, the entropy encoding process shown in FIG. 18 follows the operation of the scan unit 360. It has been noted that the non-zero coefficients in the transformed and scanned residual data are often sequences of ±1. The CAVLC coder indicates the number of high-frequency ±1 coefficients by a variable referred to as "trailing 1s" (T1s). For these non-zero coefficients, the coding efficiency is improved by using different (context-adaptive) variable length coding tables.

Referring to FIG. 18, a first step 1000 generates values "coeff_token" to encode both the total number of non-zero coefficients and the number of trailing ones. At a step 1010, the sign bit of each trailing one is encoded in a reverse scanning order. Each remaining non-zero coefficient is encoded as a "level" variable at a step 1020, thus defining the sign and magnitude of those coefficients. At a step 1030 a variable total_zeros is used to code the total number of zeros preceding the last nonzero coefficient. Finally, at a step 1040, a variable run_before is used to code the number of successive zeros preceding each non-zero coefficient in a reverse scanning order. The collected output of the variables defined above forms the encoded data.

As mentioned above, a default scanning order for the scanning operation carried out by the scan unit 360 is a zigzag scan is illustrated schematically in FIG. 16. In other arrangements, four blocks where intra-image encoding is used, a choice may be made between zigzag scanning, a horizontal raster scan and a vertical raster scan depending on the image prediction direction (FIG. 15) and the transform unit (TU) size.

The CABAC process, discussed above, will now be described in a little more detail.

CABAC, at least as far as it is used in the proposed HEVC system, involves deriving a "context" or probability model in respect of a next bit to be encoded. The context, defined by a context variable or CV, then influences how the bit is encoded. In general terms, if the next bit is the same as the value which the CV defines as the expected more probable value, then there are advantages in terms of reducing the number of output bits needed to define that data bit.

The encoding process involves mapping a bit to be encoded onto a position within a range of code values. The range of code values is shown schematically in FIG. 19A as a series of adjacent integer numbers extending from a lower limit, m_Low, to an upper limit, m_high. The difference between these two limits is m_range, where m_range=m_high−m_Low. By various techniques to be described below, in a basic CABAC system m_range is constrained to lie between 128 and 254; in another embodiment using a larger number of bits to represent m_range, m_range may lie between 256 and 510. m_Low can be any value. It can start at (say) zero, but can vary as part of the encoding process to be described.

The range of code values, m_range, is divided into two sub-ranges, by a boundary 1100 defined with respect to the context variable as:

boundary=$m\_Low+(CV*m\_range)$

So, the context variable divides the total range into two complementary sub-ranges or sub-portions of the set of code values, the proportions of the set assigned to each sub-range being determined by the variable CV, one sub-range being associated with a value (of a next data bit) of zero, and the other being associated with a value (of the next data bit) of one. The division of the range represents the probabilities assumed by the generation of the CV of the two bit values for the next bit to be encoded. So, if the sub-range associated with the value zero is less than half of the total range, this signifies that a zero is considered less probable, as the next symbol, than a one.

Various different possibilities exist for defining which way round the sub-ranges apply to the possible data bit values. In one example, a lower region of the range (that is, from m_Low to the boundary) is by convention defined as being associated with the data bit value of zero.

If more than one bit was being encoded at a single operation, more than two sub-ranges could be provided so as to give a sub-range corresponding to each possible value of the input data to be encoded.

The encoder and decoder maintain a record of which data bit value is the less probable (often termed the "least probable symbol" or LPS). The CV refers to the LPS, so the CV always represents a value of between 0 and 0.5.

A next bit is now mapped to the range m_range, as divided by the boundary. This is carried out deterministically at both the encoder and the decoder using a technique to be described in more detail below. If the next bit is a 0, a particular code value, representing a position within the sub-range from m_Low to the boundary, is assigned to that bit. If the next bit is a 1, a particular code value in the sub-range from the boundary 1100 to m_high is assigned to that bit. This represents an example of a technique by which embodiments of the invention may select one of the plurality of sub-ranges of the set of code values according to the value of the current input data bit, and also an example of a technique by which embodiments of the invention may assign the current input data value to a code value within the selected sub-range.

The lower limit m_Low and the range m_range are then redefined so as to modify the set of code values in dependence upon the assigned code value (for example, which sub-range the assigned code value fell into) and the size of the selected sub-range. If the just-encoded bit is a zero, then m_Low is unchanged but m_range is redefined to equal m_range*CV. If the just-encoded bit is a one then m_Low is moved to the boundary position (m_Low+(CV*m_range)) and m_range is redefined as the difference between the boundary and m_high (that is, (1−CV)*m_range).

After such modification, a detection is made as to whether the set of code values is less than a predetermined minimum size (for example, is m_range at least 128).

These alternatives are illustrated schematically in FIGS. 19B and 19C.

In FIG. 19B, the data bit was a 1 and so m_Low was moved up to the previous boundary position. This provides a revised or modified set of code values for use in a next bit encoding sequence. Note that in some embodiments, the value of CV is changed for the next bit encoding, at least in part on the value of the just-encoded bit. This is why the technique refers to "adaptive" contexts. The revised value of CV is used to generate a new boundary 1100'.

In FIG. 19C, a value of 0 was encoded, and so m_Low remained unchanged but m_high was moved to the previous boundary position. The value m_range is redefined or modified as the new values of m_high−m_Low.

In this example, this has resulted in m_range falling below its minimum allowable value (such as 128). When this outcome is detected, the value m_range is renormalized or size-increased—which in the present embodiments is represented by m_range being doubled, that is, shifted left by one bit, as many times as are necessary to restore m_range to the required range of 128 to 256. An example of this is illustrated in FIG. 19D, which represents the range of FIG. 19C, doubled so as to comply with the required constraints. A new boundary 1100" is derived from the next value of CV and the revised m_range. Note that m_Low is similarly renormalized or size-increased whenever m_range is renormalized. This is done in order to maintain the same ratio between m_Low and m_range.

Whenever the range has to be multiplied by two in this way, an output encoded data bit is generated, one for each renormalizing stage.

In this way, the interval m_range and the lower limit m_Low are successively modified and renormalized in dependence upon the adaptation of the CV values (which can be reproduced at the decoder) and the encoded bit stream. After a series of bits has been encoded, the resulting interval and the number of renormalizing stage uniquely defines the encoded bitstream. A decoder which knows such a final interval would in principle be able to reconstruct the encoded data. However, the underlying mathematics demonstrate that it is not actually necessary to define the interval to the decoder, but just to define one position within that interval. This is the purpose of the assigned code value, which is maintained at the encoder and passed to the decoder at the termination of encoding the data.

To give a simplified example, consider a probability space divided into 100 intervals. In this case, m_Low would represent the bottom of a probability space, and 0 and m_Range would represent its size, (100). Assume for the purposes of this example that the context variable is set at 0.5 (as it is in respect of the bypass path), so the probability space is to be used to encode binary bits with fixed probability of 50%. However, the same principles apply if adaptive values of the context variable are used, such that the same adaptation process takes place at the encoder and the decoder.

For the first bit, each symbol (0 or 1) would have a symbol range of 50, with the input symbol 0 being assigned (say) the values 0 to 49 inclusive and the input symbol 1 being assigned (say) the values 50 to 99 inclusive. If a 1 is to be the first bit to be encoded, then the final value of the stream must lie in the 50 to 99 range, hence m_Low becomes 50 and m_Range becomes 50.

To encode the second bit, the range is further subdivided into symbol ranges of 25, with an input symbol of 0 taking the values 50 to 74 and an input symbol of 1 taking the values 75 to 99. As can be seen, whichever symbol is encoded as the second bit, the final value is still between 50 and 99, preserving the first bit, but now a second bit has been encoded into the same number. Likewise if the second bit were to use a different probability model to the first, it still wouldn't affect the encoding of the first bit because the range being subdivided is still 50 to 99.

This process continues at the encoder side for each input bit, renormalizing (for example, doubling) m_Range and m_Low wherever necessary, for example in response to m_Range dropping below 50. By the end of the encoding process (when the stream is terminated) the final value has been written to the stream.

At the decoder side, the final value is read from the stream (hence the name m_Value)—say for example, the value is 68. The decoder applies the same symbol range split to the initial probability space and compares its value to see which symbol range it lies in. Seeing that 68 lies in the 50 to 99 range, it decodes a 1 as the symbol for its first bit. Applying the second range split in the same way as the encoder, it sees that 68 lies in the 50 to 74 range and decodes 0 as the second bit, and so on.

In an actual implementation, the decoder may avoid having to maintain m_Low as the encoder does by subtracting the bottom value of each decoded symbol's range from m_Value (in this case, 50 is subtracted from m_Value to leave 18). The symbol ranges are then always subdivisions of the 0 to (m_range−1) range (so the 50 to 74 range becomes 0 to 24).

It is important to note that, if only two bits were to be encoded this way, the encoder could pick any final value within the 50 to 74 range and they would all decode to the same two bits "10" (one followed by zero). More precision is only needed if further bits are to be encoded and in practice, the HEVC encoder would always pick 50, the bottom of the range. The embodiments discussed in the present application seek to make use of that unused range by finding certain bits that, when set appropriately, guarantee the final value will decode correctly regardless of what the values of the remaining bits are, freeing those remaining bits for carrying other information. For example, in the sample encode given above, if the first digit were set to 6 (or 5), then the final value would always be in the 50 to 74 range regardless of the value of the second digit; hence the second digit can be used to carry other information.

As can be seen, an endless stream of bits can be coded using the same probability range (given infinite-precision fractions) by repeatedly subdividing it. In practice however, infinite precision is impossible and non-integer numbers are to be avoided. For this purpose, renormalisation is used. If the 50 to 74 range were to be used to encode a third bit, the symbol ranges would ordinarily have to be 12.5 intervals each, but instead, m_Range and m_Low can be doubled (or otherwise multiplied by a common factor) to 50 and 100 respectively and the symbol ranges would now be subdivisions of the range of 100 to 149 i.e. 25 intervals each. This operation is equivalent to retroactively doubling the size of the initial probability space from 100 to 200. Since the decoder maintains the same m_Range, it can apply renormalisation at the same times as the encoder.

The context variable CV is defined as having (in an example embodiment) 64 possible states which successively indicate different probabilities from a lower limit (such as 1%) at CV=63 through to a 50% probability at CV=0.

In an adaptive system CV is changed or modified from one bit to the next according to various known factors, which may be different depending on the block size of data to be encoded. In some instances, the state of neighbouring and previous image blocks may be taken into account. So, the techniques described here are examples of modifying the context variable, for use in respect of a next input data value, so as to increase the proportion of the set of code values in the sub-range which was selected for the current data value.

The functions of selecting a sub-range, assigning the current bit to a code value, modifying the set of code values, detecting whether the set is less than a minimum size, and modifying the context variable may all be carried out by the context modeller 950 and the coding engine 960, acting together. So, although they are drawn as separate items in FIG. 17 for clarity of the explanation, they act together to provide a context modelling and coding function. However, for further clarity, reference is made to FIG. 20 which illustrates these operations and functionalities in more detail.

The assigned code value is generated from a table which defines, for each possible value of CV and each possible value of bits 6 and 7 of m_range (noting that bit 8 of m_range is always 1 because of the constraint on the size of m_range), a position or group of positions at which a newly encoded bit should be allocated a code value in the relevant sub-range.

Figure 20:
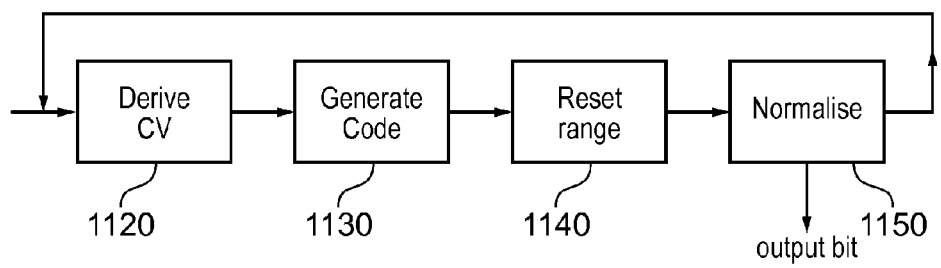
FIG. 20 schematically illustrates a CABAC encoder.

FIG. 20 schematically illustrates a CABAC encoder using the techniques described above.

The CV is initiated (in the case of the first CV) or modified (in the case of subsequent CVs) by a CV derivation unit 1120. A code generator 1130 divides the current m_range according to CV, selects a sub-range and generates an assigned data code within the appropriate sub_range, for example using the table mentioned above. A range reset unit 1140 resets m_range to that of the selected sub-range so as to modify the set of code values as described above. A normaliser 1150 detects whether the resulting value of m_range is below the minimum allowable value and, if necessary, renormalises the m_range one or more times, outputting an output encoded data bit for each such renormalisation operation. As mentioned, at the end of the process, the assigned code value is also output.

Figure 21:
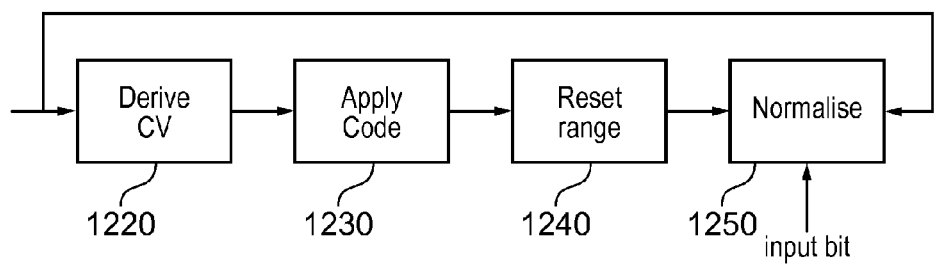
FIG. 21 schematically illustrates a CABAC decoder.

In a decoder, shown schematically in FIG. 21, the CV is initiated (in the case of the first CV) or modified (in the case of subsequent CVs) by a CV derivation unit 1220 which operates in the same way as the unit 1120 in the encoder. A code application unit 1230 divides the current m_range according to CV and detects in which sub-range the data code lies. A range reset unit 1240 resets m_range to that of the selected sub-range so as to modify the set of code values in dependence upon the assigned code value and the size of the selected sub-range. If necessary, a normaliser 1250 renormalises the m_range in response to a received data bit.

Embodiments of the invention provide a technique to terminate a CABAC stream. The embodiments will be described in the context of an example system in which the code value range has a maximum value of 512 (instead of 128 as described above) and so is constrained to lie in the upper half of this range, that is, from 256 to 510.

The technique can produce a loss of on average 1.5 bits (which is to say, a much smaller loss than previous stream termination techniques caused). A second alternative method is also presented which can produce an average loss of 1 bit. Applications of these techniques have been suggested to include termination of the CABAC stream prior to sending IPCM (non-frequency separated) data, and termination of the stream for row-per-slice. The technique is based on the recognition that the CABAC variable can be set to any value within the correct range at the time of termination. So the CABAC variable is set to a value which has a number of trailing (least significant bit) zeros, so that when the value is flushed to the data stream, the zeros can effectively be ignored.

In current techniques, terminating a CABAC stream causes 8 bits to be flushed to the data stream (that is, lost or wasted) The technique is illustrated with an example where intra frames are terminated after each LCU or image slice (that is, after encoding a group of data values representing data values relating to a particular respective image sub-area), allowing the coefficient bypass data (sign bits/escape codes) to be placed into the bit-stream in a raw format.

A process to terminate the CABAC stream is applied at the end of each slice and prior to IPCM data. In embodiments of the invention this process assumes (for the purposes of this discussion) that the probability that the stream is to be terminated is fixed at on average 0.54%. (When a data value (1 or 0) is encoded, the current m_range is subdivided into two symbol ranges, representing the probability of 1 or 0 respectively. For the special "end-of-stream flag" value, the symbol range for 1 is always 2. Hence the probability of the data value being 1 is dependent on the value of the current m_range. In some embodiments, as discussed above, m_range may vary between 256 and 510, so the termination probability therefore varies between 2/510=0.3922% and 2/256=0.7813%).

For the encoder, this process is:
if the stream is not to be terminated, the CABAC range m_range is decremented by 2, and the CABAC engine is renormalized by 1 place if required (which is to say that m_Low and m_range are renormalized); processing on the current CABAC stream continues.

if the stream is to be terminated, the CABAC 'm_Low' is incremented by the range less 2', the range is set to 2, and the CABAC engine is renormalized by 7 places, followed by outputting a further binary '1'. This process is equivalent to a renormalization of 8 places, where the value being renormalized has been forced to be an odd number.

There may be occasions where the above process is not ideal—i.e. where the probability of the stream is variable, or fixed at a higher percentage, or even a certainty (probability of 1).

Embodiments of the invention can provide a method whereby the CABAC stream can be immediately terminated with just 2 renormalizations, with a loss of (on average) 1.5 bits and negligible impact on the decoder and encoder complexity. An alternative method is also indicated that can reduce the overhead to just 1 bit, but at the expense of an increase in CABAC decoder complexity. Both methods can then be used in conjunction with a standard adaptive context variable if there is a variable probability of termination, or in conjunction with a fixed percentage mechanism (akin to a non-adaptive context variable).

Note that as discussed above, m_Low and m_Range are renormalised together.

1 Algorithm 1.1 Method

The steps of the encoder are as follows:

--- m_Low=(m_Low+128)&~127
{or m_Low=(m_Low+127)&~127}
Force 2 stages of renormalization of m_Low and call test_write_out( )
[write the value to the stream]
Prior to encoding next CABAC stream, set m_Range=510, m_Low=0.

---

Notation: & is an AND operation, and ~ signifies the binary inverse (so ~127 is the binary inverse of the binary value corresponding to decimal 127, so that an AND operation with the binary inverse of a number such as decimal 127 (which has a plurality of least significant bits or LSBs equal to 1) is equivalent to setting that number of LSBs of the resulting value to zero). The function test_write_out ( ) checks whether any bits at the top (MSB end) of m_Low are eligible to be sent to the output stream, writing them if so. In the context of the pseudo-code shown above, the new bits created by the "forced renormalisation" will be written by this operation.

The steps of the decoder are as follows:

---

Rewind input stream by 7 bits (i.e. move read position back by 7 bits).
Prior to decoding next CABAC stream, set m_Range=0, and read m_value from bit-stream.

---

This method has a low processing impact on the decoder and encoder.

In respect of m_Low, note that the encoder generates a stream by repeatedly adding to m_Low. The decoder reads that stream by starting with the encoder's final result and repeatedly subtracting from it. The decoder calls the bits read from the stream "m_uiValue" (or m_value in the notation of this description) rather than m_Low and it is this that should be read from the bit stream. This is relevant in this case where some embodiments of the invention require that the decoder maintain m_Low as well as m_uiValue so it knows what the encoder is doing. In that case, m_Low is generated at the decoder in exactly the same way as the encoder's m_Low.

Alternative Method

This method increases the complexity of current decoders as it requires that the decoder maintains m_Low. If maintenance of m_Low is required by other proposals, then this additional complexity is again minimal.

The steps of the encoder are as follows:

---

Let test256=(m_Low+255)&~255
If (test256+256 < m_Low+m_Range)
    m_Low=m_test256
    Force 1 stage of renormalization of m_Low and call test_write_out( ).
Else (as before)
    m_Low=(m_Low+128)&~127        { or
    m_Low=(m_Low+127)&~127 }
    Force 2 stages of renormalization of m_Low and call test_write_out( ).
Prior to encoding next CABAC stream, set m_Range=510, m_Low=0.

---

The steps of the decoder are as follows:

---

Let test256=(m_Low+255)&~255
If (test256+256 < m_Low+m_Range)
    Rewind stream by 8 bits
Else (as before)
    Rewind stream by 7 bits
Prior to decoding next CABAC stream, set m_Range=0, set m_Low = 0 and read m_value from bit-stream.

---

Theory

For the CABAC encoder, the data written to the stream (or buffered) is concatenated with m_Low is an n-bit value low indicating the lowest value that the final output can be. The highest value, high, is the sum of low and m_Range, a variable maintained by the encoder to be within the range 256 (inclusive) to 511 (exclusive). At the end of the stream, any value between low (inclusive) and high (exclusive) can be selected as the final output value, without affecting the decode. If the decode could occur without being dependent on the n LSBs of the value, then the n LSBs could be replaced with data from the next section of the bit-stream.

Let v be a value between low and high where n LSBs are 0, and where if the last n LSBs were 1, the resulting value V would still be less than high. Since "high−low" is at least 256, then there will always be a value v between low and high that has at least 7 LSBs that are 0. i.e. the value v is the first value between low and high that is divisible by 128 without a remainder.

The simplest manner to achieve this is a standard power-of-2 alignment routine, namely:

$$v=(low+127)\&\sim127$$

However, since range is at least 256, then:

$$v=(low+128)\&\sim127$$

is also sufficient (and results in a slightly smaller encoder).

For the current part of the bit-stream, the encoder would output the value 'v', except for the bottom 7 bits, this is achieved by renormalizing m_Low by 2 places. At the end of the bit-stream, the decoder would have read 7 bits from the next section of the bit stream, and therefore would have to 'rewind' the bit-stream by 7 bits.

There are cases where the bottom 8 bits are not required to fully decode the stream, with the simplest illustration being where "m_Low=0", and these are explored by the alternative algorithm. In this alternative algorithm, the value v between low and high with 8 LSBs of 0 is calculated, and then a test is applied to check if there is a corresponding value V. The decision process requires tests on low and high, and since the decoder must also make the same decision, the decoder would need to track m_Low.

In both versions of the encoder algorithm, there is a choice for the 7-bit path, which will result in a different bit-stream, but will be decodable by the same decoder.

With reference to FIG. 20 described above, the units 1120 and 1130 represent embodiments of a selector to select one of a plurality of complementary sub-ranges of a set of code values, and a data assigning unit to assign the current input value to a code value. The unit 1140 represents an embodiment of a data modifying unit. The unit 1150 represents an embodiment of a detector for detecting whether the set of code values is less than a minimum size and to carry out the other functions of that detector accordingly. The unit 1150 also represents an embodiment of a data terminator by carrying out the data termination functionality described above and that described below, and in particular by making the decision as to when to terminate the stream.

With reference to FIG. 21 described above, the units 1220, 1230, 1240 and 1250 collectively represent embodiments of a pointer controller and a setting unit, in that they are operable to carry out the functionality described above in respect of these units.

Applications

Possible applications for this include:

1. Termination for the last encoded LCU for a slice, especially in a 'row-per-slice' style configuration, where the probability may be significantly higher than 0.54%; in this arrangement, embodiments of the invention can provide a data encoding method for encoding successive input data values representing video data, the method comprising the steps of: selecting one of a plurality of complementary sub-ranges of a set of code values according to the value of a current input data value, the proportions of the sub-ranges relative to the set of code values being defined by a context variable associated with that input data value; assigning the current input data value to a code value within the selected sub-range; modifying the set of code values in dependence upon the assigned code value and the size of the selected sub-range; detecting whether the set of code values is less than a predetermined minimum size and if so, successively increasing the size of the set of code values until it has at least the predetermined minimum size; and outputting an encoded data bit in response to each such size-increasing operation; modifying the context variable, for use in respect of a next input data bit or value, so as to increase the proportion of the set of code values in the sub-range which was selected for the current data value; and after encoding a group of input data values corresponding to a set of blocks of video data within a slice of the video data which is encoded without reference to other video data, terminating the output data by: setting a value defining an end of the set of code values to a value having a plurality of least significant bits equal to zero; increasing the size of the set of code values; and writing the value defining the end of the set of code values to the output data.

2. Termination for the last possible LCU for a slice, as termination after the last possible LCU of a slice is a certainty; in this arrangement, embodiments of the invention can provide a data encoding method for encoding successive input data values representing video data, the method comprising the steps of: selecting one of a plurality of complementary sub-ranges of a set of code values according to the value of a current input data value, the proportions of the sub-ranges relative to the set of code values being defined by a context variable associated with that input data value; assigning the current input data value to a code value within the selected sub-range; modifying the set of code values in dependence upon the assigned code value and the size of the selected sub-range; detecting whether the set of code values is less than a predetermined minimum size and if so, successively increasing the size of the set of code values until it has at least the predetermined minimum size; and outputting an encoded data bit in response to each such size-increasing operation; modifying the context variable, for use in respect of a next input data bit or value, so as to increase the proportion of the set of code values in the sub-range which was selected for the current data value; and after encoding a group of input data values representing the whole of a slice of video data which is encoded without reference to other video data, terminating the output data by: setting a value defining an end of the set of code values to a value having a plurality of least significant bits equal to zero; increasing the size of the set of code values; and writing the value defining the end of the set of code values to the output data.

3. Termination prior to IPCM data, possibly in conjunction with a context variable; in this arrangement, embodiments of the invention can provide a data encoding method for encoding successive input data values representing frequency separated video data, the method comprising the steps of: selecting one of a plurality of complementary sub-ranges of a set of code values according to the value of a current input data value, the proportions of the sub-ranges relative to the set of code values being defined by a context variable associated with that input data value; assigning the current input data value to a code value within the selected sub-range; modifying the set of code values in dependence upon the assigned code value and the size of the selected sub-range; detecting whether the set of code values is less than a predetermined minimum size and if so, successively increasing the size of the set of code values until it has at least the predetermined minimum size; and outputting an encoded data bit in response to each such size-increasing operation; modifying the context variable, for use in respect of a next input data bit or value, so as to increase the proportion of the set of code values in the sub-range which was selected for the current data value; and after encoding a group of input data values such that a next group of data values to be encoded represent non-frequency-separated video data, terminating the output data by: setting a value defining an end of the set of code values to a value having a plurality of least significant bits equal to zero; increasing the size of the set of code values; and writing the value defining the end of the set of code values to the output data.

4. Termination of the stream to prevent the "bits outstanding" mechanism getting too long; in this arrangement, embodiments of the invention can provide a data encoding method for encoding successive input data values, the method comprising the steps of: selecting one of a plurality of complementary sub-ranges of a set of code values according to the value of a current input data value, the proportions of the sub-ranges relative to the set of code values being defined by a context variable associated with that input data value; assigning the current input data value to a code value within the selected sub-range; modifying the set of code values in dependence upon the assigned code value and the size of the selected sub-range; detecting whether the set of code values is less than a predetermined minimum size and if so, successively increasing the size of the set of code values until it has at least the predetermined minimum size; and outputting an encoded data bit in response to each such size-increasing operation; modifying the context variable, for use in respect of a next input data bit or value, so as to increase the proportion of the set of code values in the sub-range which was selected for the current data value; detecting whether a set of data values to be encoded by a different encoding technique exceeds a predetermined size, and if so, terminating the output data by: setting a value defining an end of the set of code values to a value having a plurality of least significant bits equal to zero; increasing the size of the set of code values; and writing the value defining the end of the set of code values to the output data.

Thus, the foregoing discussion discloses and describes merely exemplary embodiments of the present invention. As will be understood by those skilled in the art, the present invention may be embodied in other specific forms without departing from the spirit or essential characteristics thereof. Accordingly, the disclosure of the present invention is intended to be illustrative, but not limiting of the scope of the invention, as well as other claims. The disclosure, including any readily discernible variants of the teachings herein, defines, in part, the scope of the foregoing claim terminology such that no inventive subject matter is dedicated to the public.

The invention claimed is:

1. A image data encoding method comprising:
    selecting one of a plurality of complementary sub-ranges of a set of code values according to a value of a current input data value, proportions of the sub-ranges relative to the set of code values being defined by a context variable associated with the input data value;
    assigning the current input data value to a code value within the selected sub-range;
    modifying the set of code values in dependence upon the assigned code value and a size of the selected sub-range;
    detecting whether the set of code values is less than a predetermined minimum size and if so, successively increasing the size of the set of code values until reaching at least the predetermined minimum size;
    outputting an encoded data bit in response to each size-increasing operation;
    modifying the context variable, for use in respect of a next input data value, to increase a proportion of the set of code values in the sub-range which was selected for the current data value;
    and after encoding a group of input data values, terminating by circuitry the output data by: setting a value defining an end of the set of code values to a value having a plurality of least significant bits equal to zero to have the plurality of least significant bits ignored to reduce a number of bits to be outputted at the termination of the output data;
    increasing the size of the set of code values;
    and writing the value defining the end of the set of code values to the output data.

2. The method according to claim 1, wherein the plurality of least significant bits comprises seven least significant bits.

3. The method according to claim 1, wherein the data values represent frequency separated video data.

4. The method according to claim 3, wherein:
    each group of data values comprises data values relating to a particular respective image sub-area;
    and the output data is terminated at the end of encoding each image sub-area.

5. The method according to claim 4, wherein the sub-areas are image slices or image largest coding units (LCUs).

6. The method according to claim 1, wherein the value defining the end of the set of code values represents a lower limit of the set of code values.

7. The method according to claim 1, wherein the terminating step is carried out after encoding a group of input data values corresponding to a set of blocks of video data within a slice of the video data which is encoded without reference to other video data;
    after encoding a group of input data values representing the whole of a slice of video data which is encoded without reference to other video data;
    after encoding a group of input data values such that a next group of data values to be encoded represent non-frequency-separated video data and/or when a set of data values to be encoded by a different encoding technique is detected to exceed a predetermined size.

8. The method according to claim 1, wherein in which the terminating step comprises:
    detecting whether a test value dependent upon a lower limit of the set of code values, plus the predetermined minimum size, is less than an upper limit of the set of code values;
    and, if so: setting the lower limit of the set of code values to the test value;
    doubling the size of the set of code values and the lower limit respectively;
    and writing the value defining the lower limit to the output data;
    and if not: setting the lower limit of the set of code values to a value having a plurality of least significant bits equal to zero;
    multiplying the size of the set of code values and the lower limit, respectively, by four;
    and writing the value defining the lower limit to the output data.

9. The method according to claim 8, wherein the test value is dependent upon the lower limit, plus a constant, with a plurality of least significant bits then set to zero.

10. A image data decoding method for decoding successive arithmetic-encoded data values, the method comprising:
    moving a read pointer back in an input data stream by a predetermined number of bit positions to avoid interpreting the predetermined number of bit positions from a next input data stream;
    defining a range of a set of code values as zero;
    reading, from the input data stream, a stream value indicating a parameter of a set of code values;
    setting the proportions of respective sub-ranges relative to the set of code values according to a context variable;
    and detecting by circuitry a current decoded output data value according to which sub-range the stream value lies in.

11. The method according to claim 10, comprising:
    reading a value indicating an end of the set of code values from the input data stream.

12. The method according to claim 10, comprising:
    maintaining a value indicating an end of the set of code values during decoding.

13. A video decoding method comprising entropy decoding encoded video data by applying the method of claim 10.

14. A image data encoding apparatus comprising:
    a selector configured to select one of a plurality of complementary sub-ranges of a set of code values according to the value of a current input data value, proportions of the sub-ranges relative to the set of code values being defined by a context variable associated with the input data value;

a data assigning circuit configured to assign the current input data value to a code value within the selected sub-range;

a data modifying circuit configured to modify the set of code values in dependence upon the assigned code value and a size of the selected sub-range;

a detector configured to detect whether the set of code values is less than a predetermined minimum size and if so, successively increasing the size of the set of code values until reaching at least the predetermined minimum size; to output an encoded data bit in response to each such size-increasing operation;

and to modify the context variable, for use in respect of a next input data value, to increase the proportion of the set of code values in the sub-range which was selected for the current data value;

and after encoding a group of input data values, a data terminator to terminate the output data by:

setting a value defining an end of the set of code values to a value having a plurality of least significant bits equal to zero to have the plurality of least significant bits ignored to reduce a number of bits to be outputted at the termination of the output data;

increasing the size of the set of code values;

and writing the value defining the end of the set of code values to the output data.

15. A image data decoding apparatus comprising:

a pointer controller configured to move a read pointer back in an input data stream by a predetermined number of bit positions to avoid interpreting the predetermined number of bit positions from a next input data stream;

a setting circuit configured to define a range of a set of code values as zero, to read, from the input data stream, a stream value indicating a parameter of a set of code values;

to set the proportions of respective sub-ranges relative to the set of code values according to a context variable;

and to detect a current decoded output data value according to which sub-range the stream value lies in.

16. Video coding apparatus comprising: a frequency domain transformer configured to generate frequency domain coefficients dependent upon respective portions of an input video signal and ordering the coefficients for encoding according to an encoding order;

And an entropy encoder configured to encode the ordered coefficients, the entropy encoder comprising apparatus according to claim 14.

* * * * *